United States Patent
Kwon (10) Patent No.: US 10,454,299 B2
(45) Date of Patent: Oct. 22, 2019

(54) POWER BLACKOUT SENSING SYSTEM WITH A PHANTOM VOLTAGE DETECTOR

(71) Applicant: Ig Soo Kwon, San Ramon, CA (US)

(72) Inventor: Ig Soo Kwon, San Ramon, CA (US)

(*) Notice: Subject to any disclaimer, the term of this patent is extended or adjusted under 35 U.S.C. 154(b) by 252 days.

(21) Appl. No.: 15/587,147

(22) Filed: May 4, 2017

(65) Prior Publication Data
US 2017/0324272 A1    Nov. 9, 2017

Related U.S. Application Data (60) Provisional application No. 62/359,538, filed on Jul. 7, 2016, provisional application No. 62/332,421, filed on May 5, 2016.

(51) Int. Cl.
| | | |
|---|---|---|
| H02J 9/00 | (2006.01) | |
| H02J 9/06 | (2006.01) | |
| G01R 19/155 | (2006.01) | |

(52) U.S. Cl.
CPC .......... H02J 9/061 (2013.01); G01R 19/155 (2013.01)

(58) Field of Classification Search
CPC ..................................... H02J 9/061
USPC ..................................... 307/64, 66
See application file for complete search history.

(56) References Cited

U.S. PATENT DOCUMENTS

| | | | | |
|---|---|---|---|---|
| 3,976,986 A * | 8/1976 | Zabroski | ............ | F21L 4/08 340/656 |
| 4,323,820 A * | 4/1982 | Teich | ............ | H02J 9/065 307/66 |
| 5,148,158 A * | 9/1992 | Shah | ............ | G08B 29/126 315/86 |
| 8,299,712 B2 * | 10/2012 | Smith, III | ............ | F21K 9/232 315/86 |
| 8,907,523 B2 * | 12/2014 | Mohammed Suhura | ............ | H02J 9/065 307/66 |
| 9,425,649 B2 * | 8/2016 | Singer | ............ | H02J 9/061 |
| 2012/0039063 A1 * | 2/2012 | Chao | ............ | F21S 9/022 362/20 |
| 2014/0265845 A1 * | 9/2014 | Williams | ............ | H05B 37/0245 315/86 |
| 2015/0155743 A1 * | 6/2015 | Noguchi | ............ | H05B 33/0806 307/23 |
| 2015/0194843 A1 * | 7/2015 | Singer | ............ | H02J 9/061 315/86 |
| 2016/0211699 A1 * | 7/2016 | Kwon | ............ | H02J 9/061 |
| 2016/0328928 A1 * | 11/2016 | Lutz | ............ | G08B 5/36 |
| 2018/0331567 A1 * | 11/2018 | Beghelli | ............ | H02J 9/065 |

* cited by examiner

*Primary Examiner* — Adi Amrany
(74) *Attorney, Agent, or Firm* — Innovation Counsel LLP (57) ABSTRACT

A power black-out sensing system includes: a primary power source providing an alternating current (AC) power using three phase wires and a neutral wire; a secondary power source; a sensing block comprising one or more sensing elements; and a rectifier configured to rectify the AC power from the primary power source and providing a rectified power to the sensing block voltage detector. Two wires of the three phases wires and the neutral wire of the primary power source are connected to rectifier, and a first wire of the two wires is connected to the rectifier via a switch and a second wire of the two wires is directly connected to the rectifier. The sensing block detects a phantom voltage and provides an output signal corresponding the secondary power source during a blackout period.

20 Claims, 9 Drawing Sheets

FIG. 9

POWER BLACKOUT SENSING SYSTEM WITH A PHANTOM VOLTAGE DETECTOR

CROSS-REFERENCE TO RELATED APPLICATION(S)

This application claims the benefits of and priority to U.S. Provisional Patent Application Ser. No. 62/332,421 filed May 5, 2016 and 62/359,538 filed Jul. 7, 2016, the disclosures of which are incorporated herein by reference in their entirety.

TECHNICAL FIELD

The present disclosure relates generally to a power blackout sensing system, more particularly, to a power blackout sensing system including a phantom voltage detector.

BACKGROUND

In general, a live power is required for an emergency power surge detector or an emergency light to operate in a power shutdown condition. A typical emergency lighting system is in a stand-by condition or powered on using a live power during a normal condition and is powered by an internal battery during a blackout period when the live power supply is cut off. For most residential or commercial applications, a power utility construction is required to implement an emergency lighting system to supply a live power, which can be not only time consuming but also costly.

SUMMARY

According to one embodiment, a power black-out sensing system includes: a primary power source providing an alternating current (AC) power using three phase wires and a neutral wire; a secondary power source; a sensing block comprising one or more sensing elements; and a rectifier configured to rectify the AC power from the primary power source and providing a rectified power to the sensing block voltage detector. Two wires of the three phases wires and the neutral wire of the primary power source are connected to the rectifier, and a first wire of the two wires is connected to the rectifier via a switch and a second wire of the two wires is directly connected to the rectifier. The sensing block detects a phantom voltage and provides an output signal corresponding the secondary power source during a blackout period.

According to another embodiment, a phantom voltage detector includes one or more sensing elements coupled to a rectifier. The rectifier is configured to rectify an AC power from a primary power source. Two wires of three phases wires and a neutral wire of the primary power source are connected to the rectifier, and a first wire of the two wires is connected to the rectifier via a switch and a second wire of the two wires is directly connected to the rectifier. The one or more sensing elements detects a phantom voltage and the phantom voltage detector provides an output signal corresponding a secondary power source during a blackout period.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a power blackout sensing system including a phantom voltage detector. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a power blackout sensing system. The present power blackout sensing system includes a secondary power source (e.g., a battery) and a phantom voltage detector and can be coupled to an external device or system. According to one embodiment, the external device is a light emitting diode (LED) light. The phantom voltage detector can differentiate a switch on/off condition from a power blackout condition. In a power blackout condition, the phantom voltage detector generates a signal to supply a secondary power to the coupled device or system until the main power to the system is restored.

The present power blackout sensing system can reduce or eliminate a need for constructing power utility (e.g., wiring to a permanent live power supply or a secondary power supply) to build an emergency lighting system. Therefore, the cost, time, and effort for implementing an emergency lighting system can be saved. Other applicable examples of the present power blackout sensing system include, but are not limited to, medical equipment and high-precision machines that require a seamless operation even in a power blackout condition.

According to another embodiment, an LED light integrates the present power blackout sensing system including a battery and a phantom voltage detector. The LED light can detect a power blackout condition using the integrated phantom voltage detector. The LED light can be used as an emergency light in a complete power blackout condition.

Figure 1:
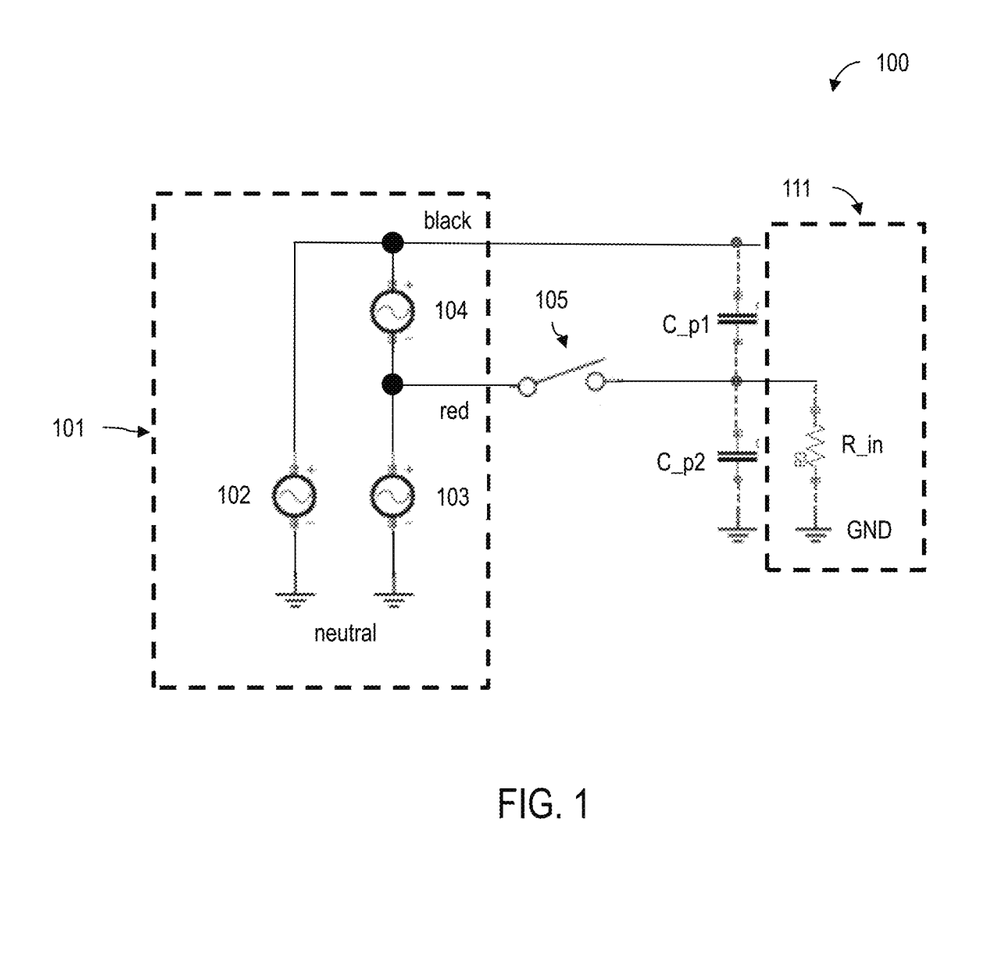
FIG. 1 shows a block diagram of an example power blackout sensing system, according to one embodiment.

FIG. 1 shows a block diagram of an example power blackout sensing system, according to one embodiment. The example power blackout sensing system 100 includes a sensing block 111 connected to an alternating current (AC) power source 101 (e.g., AC 100V, 60 Hz).

According to one embodiment, the AC power source 101 is a three-phase AC power source including three wires (e.g., black, red, and white wires) and a ground wire (neutral) (e.g., a bare copper wire). Among the three wires, two wires (e.g., black and red wires) can be connected to the sensing block 111. The present example will be described for an exemplary case where the black and red wires are connected to the sensing block 111; however, it is noted that any other two wires can be connected to the sensing block 111 without deviating from the scope of the present disclosure.

During a normal power-on condition, the AC power source 101 exhibits three phases including a first phase 102 between a black wire and a neutral wire (e.g., AC 57.8V), a second phase 103 between a red wire and the neutral wire (e.g., AC 57.8V), and a third phase 104 between the black wire and the red wire (e.g., AC 100V).

The black wire is always connected to the sensing block 111 while the red wire is connected to the sensing block 111 via a switch 105. Parasitic capacitances exist between the black wire and the red wire, and between the red wire and the ground, respectively. The parasitic capacitors $C\_p1$ represents a parasitic capacitor of the black wire and the red wire, and the second parasitic capacitor $C\_p2$ represents a parasitic capacitor between the red wire and the ground. The sensing block 111 includes a sensing block input resistor R_in (herein also referred to as a phantom resistor) connected between the red wire and the ground of the sensing block 111.

When the switch 105 is off, a phantom voltage that is biased to the red wire can be expressed as:

$$V\_phantom = V\_black * (C\_p1)/(C\_p1+C\_p2).$$

Herein, V_phantom can be small because the parasitic capacitor C_p1 is relatively small compared to the parasitic capacitor C_p2. In a case where the amount of charges stored in the parasitic capacitors is small, the parasitic capacitors cannot be used a secondary power source.

For example, if the parasitic capacitance values are the same, i.e., $C\_p1 = C\_p2$, the phantom voltage can be expressed as:

$$V\_phantom = 0.5 * V\_black.$$

Figure 2:
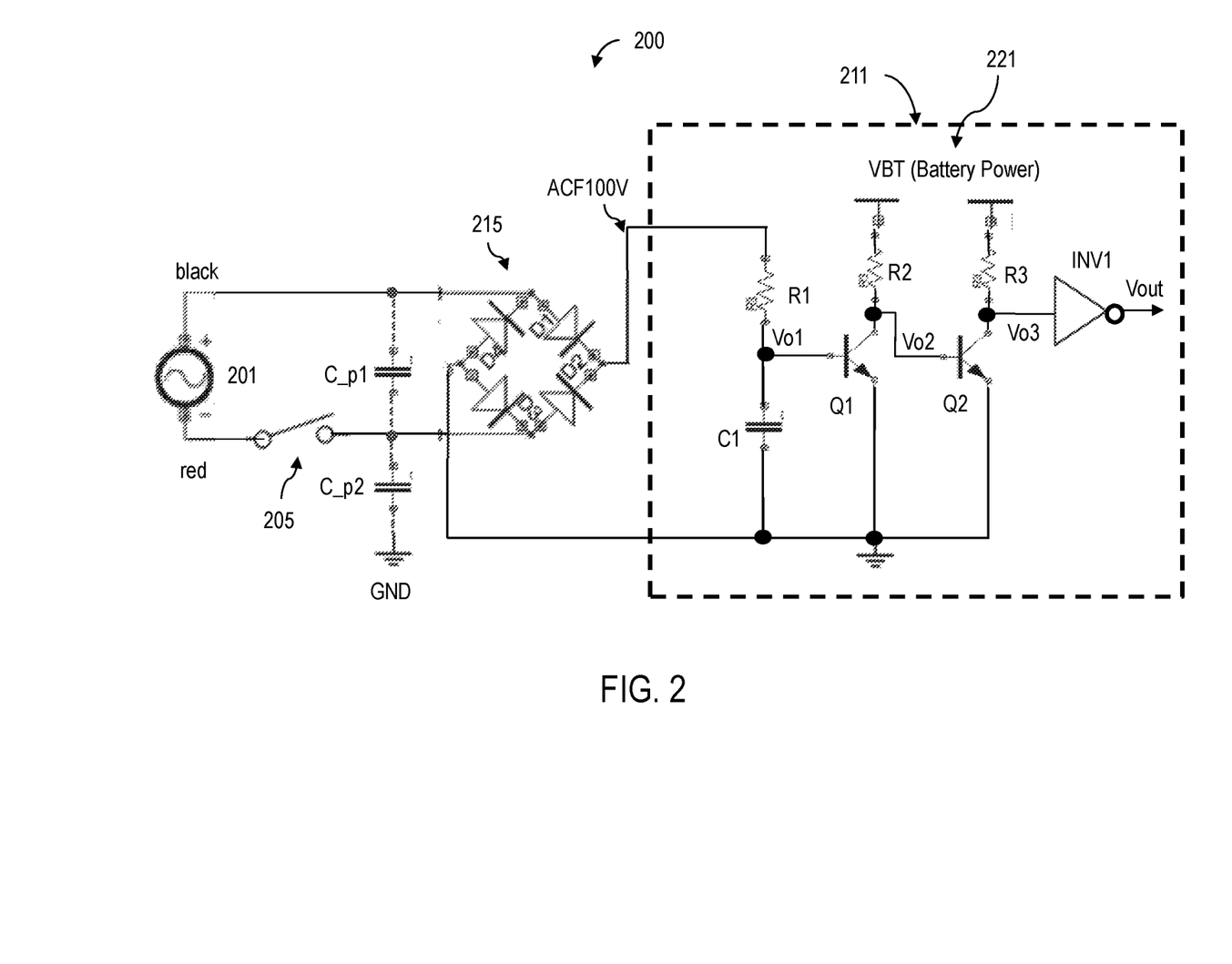
FIG. 2 shows an example power blackout sensing system including a secondary power source, according to one embodiment.

FIG. 2 shows an example power blackout sensing system including a secondary power source, according to one embodiment. The power blackout sensing system 200 includes an AC power source 201 (primary power source), a switch 205, a rectifier 215 for rectifying an AC power of the AC power source 201 to a positive voltage, a sensing block 211 including a sensing block input resistor R1, a capacitor C1, transistors Q1 and Q2, and an inverter INV1 that provides an output voltage Vout. The sensing block input resistor R1 and the capacitor C1 According to one embodiment, the transistors Q1 and Q2 are NPN bipolar transistors. The output voltage Vout is supplied to an external device or a device that integrates the sensing block 211. During a power blackout condition, the secondary power source 221 can supply power to the external device or the device that integrates the sensing block 211.

Figure 3:
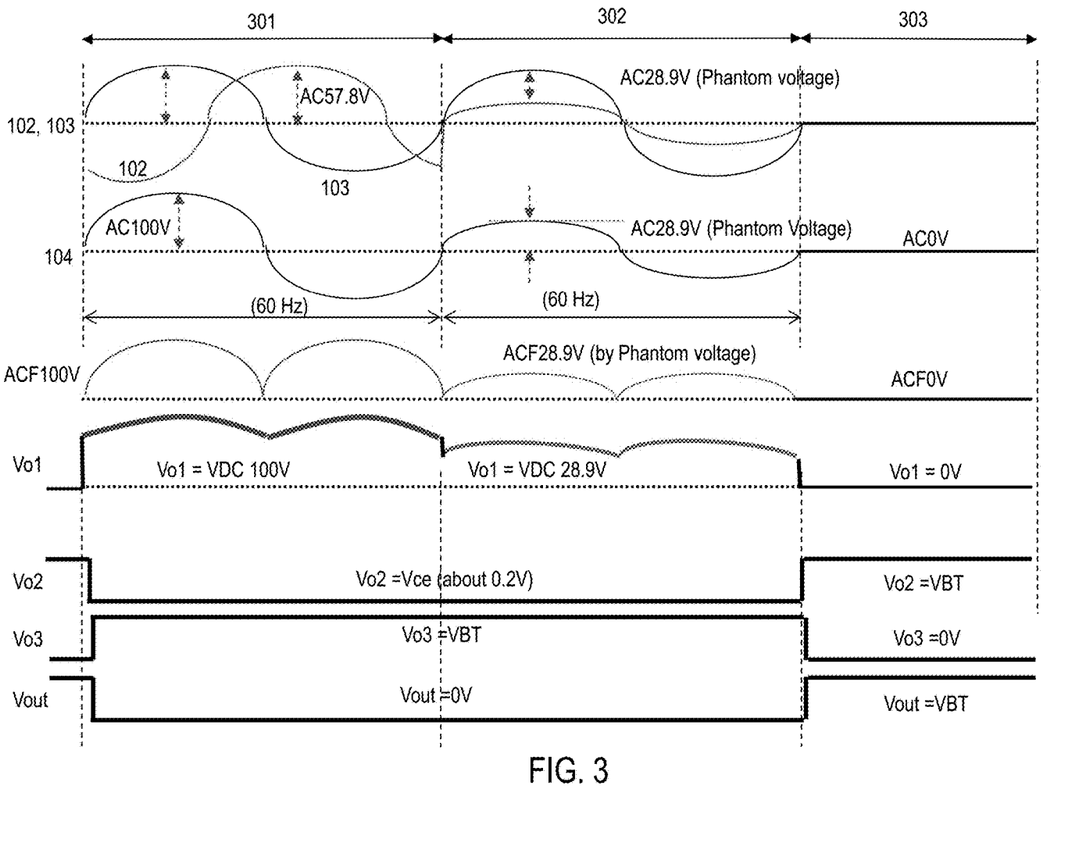
FIG. 3 shows a timing diagram for an example power blackout sensing system, according to one embodiment.

FIG. 3 shows a timing diagram for an example power blackout sensing system, according to one embodiment.

During a switch-on period 301, AC57.8V appears between the black and neutral wires (the first phase 102), and the red and the neutral wires (the second phase 103) with a 120-degree phase difference. The voltage between the black and the red wires (the third phase 104) is AC100V (the third phase power=1 phase power*1.73).

During a switch-off period 302, a phantom voltage of AC28.9V is measured between the black and red wires (the third phase 104). However, during a blackout period 303, no voltages are measured on both the black and red wires, thus no phantom voltage is measured.

Referring to FIGS. 2 and 3, an output voltage from the rectifier 215 is measured to be a rectified AC100V (herein denoted as ACF100V) during the switch-on period 301. The phantom voltage of ACF28.9V is measured during the switch-off period 302; however, no voltage is detected during the blackout period 303. The phantom voltage is converted to a direct current (DC) level Vo1 by the resistor R1 and the capacitor C1. When Vo1 is higher than the base-emitter voltage (VBE) of the transistor Q1, the transistor Q1 amplifies the phantom voltage as well as the current. To complete the amplification of the phantom voltage, the transistor Q2 and the inverter INV1 are used to convert the phantom voltage to intermediate voltages Vo2 and Vo3, and the output signal Vout as shown in FIG. 2. The voltage Vo3 is high (e.g., 18V of the battery) during the switch-on period 301 or the switch-off period 302 and a low (e.g., 0V) during the blackout period 303. Using the inverter INV1, the sensing block 211 outputs the output signal Vout. During the switch-on period 401 or the switch-off period 302, the output signal Vout is zero whereas the voltage of the secondary power source (e.g., 18V of the battery) is output to the output signal Vout during the power blackout period 303.

In the present example shown in FIGS. 1 and 2, the black wire is shown to be always connected to the sensing block whereas the red wire is connected to the sensing block via a switch. The stray voltage of the black wire may appear on the red wire as a phantom voltage during a switch-off period. The present power blackout sensing system can utilize the stray voltage that appears on the red wire to differentiate a power blackout condition from a switch-off condition. During the power blackout period, the sensing block provides the power from an integrated secondary power source (e.g., a battery) to a connected system or device.

Figure 4:
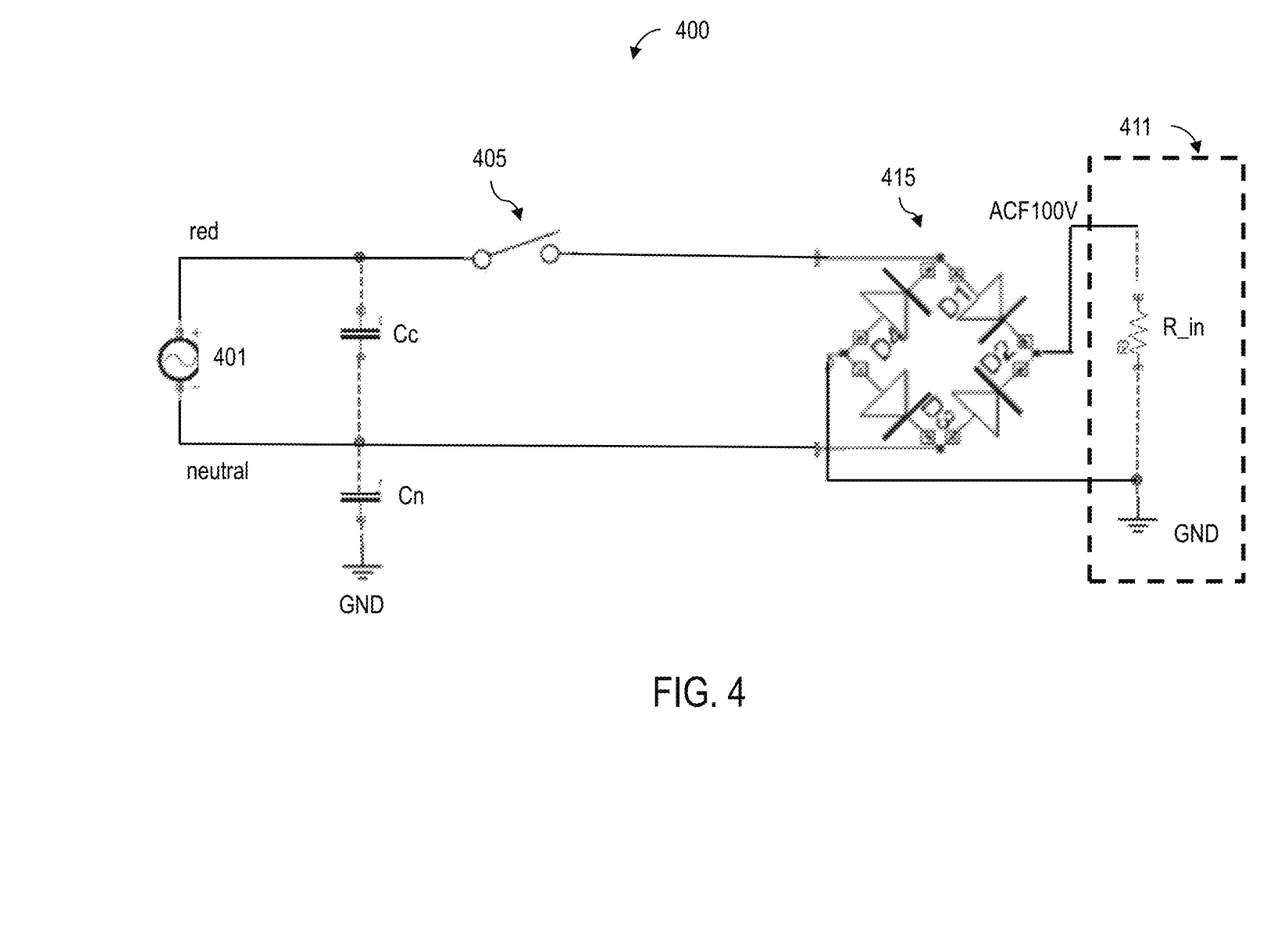
FIG. 4 shows a block diagram of an example power blackout sensing system, according to one embodiment.

FIG. 4 shows a block diagram of an example power blackout sensing system, according to one embodiment. The example power blackout sensing system 400 includes a sensing block 411 connected to an alternating current (AC) power source 401 (e.g., AC 100V, 60 Hz).

According to one embodiment, the AC power source 401 is a three-phase AC power source including three wires (e.g., black, red, and white wires) and a ground wire (neutral) (e.g., a bare copper wire). One of the three wires (e.g., red) and a neutral wire are connected to the sensing block 411. The present example will be described for an exemplary case where the red and neutral wires are connected to the sensing block 411; however, it is noted that any other two wires (e.g., black and white wires) can be connected to the sensing block 411 without deviating from the scope of the present disclosure.

The neutral wire is always connected to the sensing block 111 while the red wire is connected to the sensing block 411 via a switch 405. Parasitic capacitances exist between the red wire and the neutral wire, and between the neutral wire and the ground, respectively. The parasitic capacitors Cc represents a parasitic capacitor of the red wire and the neutral wire, and the second parasitic capacitor Cn represents a parasitic capacitor between the neutral wire and the ground. The sensing block 411 includes a sensing block input resistor R_in (herein also referred to as a phantom resistor) connected between the red wire and the ground of the sensing block 411.

When the switch is off, a phantom voltage that is biased to the neutral wire can be expressed as:

$$V\_phantom = AC100V * (Cc)/(Cc+Cn).$$

Herein, V_phantom is small because the parasitic capacitor Cc is small compared to the parasitic capacitor Cn. In a case where the amount of charges stored in the parasitic capacitors is small, the parasitic capacitors cannot be used a secondary power source.

For example, if Cc=50*Cn, the phantom voltage can be expressed as:

$$V\_phantom = AC100V * (1/(50+1))$$
$$= AC1.96V = DC0.98V.$$

Here, DC 0.98V corresponds to the AC 1.96V appearing during half cycle)

Figure 6:
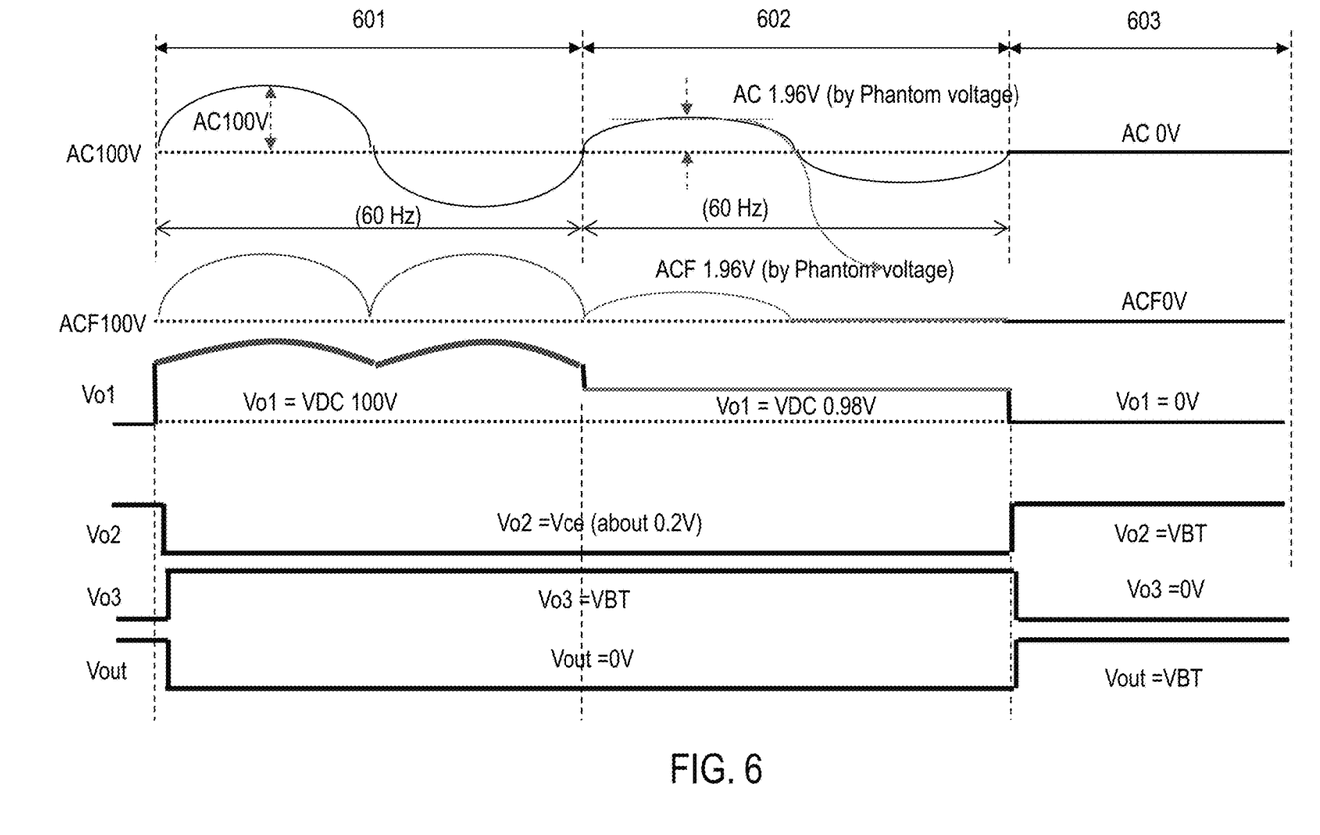
FIG. 6 shows an example timing diagram for the power blackout sensing system, according to one embodiment.

FIG. 6 shows an example timing diagram for the power blackout sensing system, according to one embodiment. During a switch-on period 601, AC100V appears between the red and neutral wires.

During a switch-off period 602, a phantom voltage of AC1.96V is measured between the red and neutral wires. However, during a blackout period 603, no voltages are measured on both the red and neutral wires, thus no phantom voltage is measured.

Figure 5:
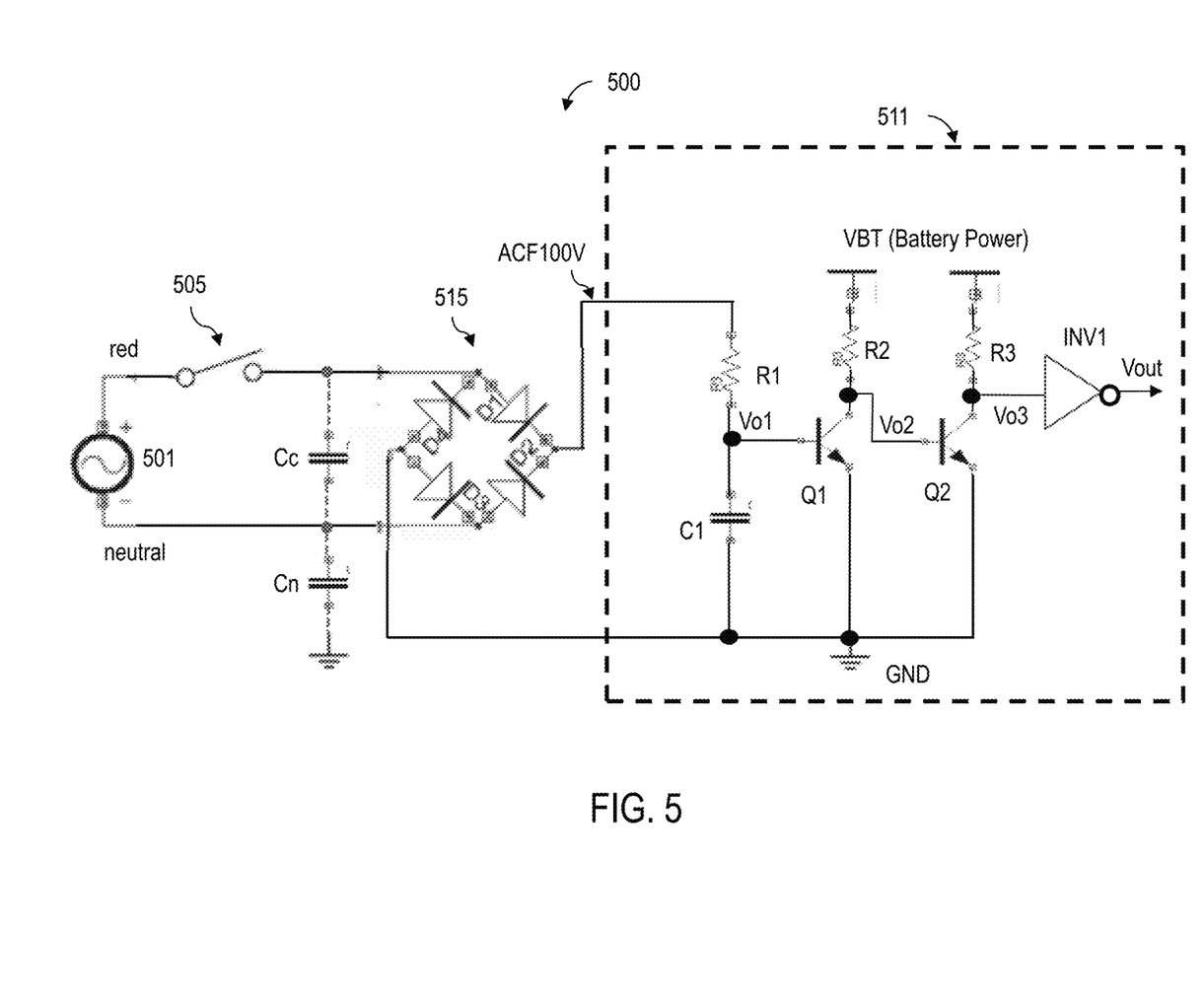
FIG. 5 shows an example power blackout sensing system including a secondary power source, according to one embodiment.

Referring to FIGS. 5 and 6, an output voltage from the rectifier 515 is measured to be a rectified AC100V (herein denoted as ACF100V) during the switch-on period 601. The phantom voltage of ACF1.96V is measured during the switch-off period 602; however, no voltage is detected during the blackout period 603. The phantom voltage is converted to a DC level Vo1 by the resistor R1 and the capacitor C1. When Vo1 is higher than the base-emitter voltage (VBE) of the NPN transistor Q1, the transistor Q1 amplifies the phantom voltage as well as the current. To complete the amplification of the phantom voltage, the transistor Q2 and the inverter INV1 are used to convert the phantom voltage to intermediate voltages Vo2 and Vo3, and the output signal Vout as shown in FIG. 5. The signal Vo3 is high (e.g., 18V of the battery) during the switch-on period 601 or the switch-off period 602 and a low (0V) during the blackout period 603. Using the inverter INV1, the sensing block 511 outputs the output signal Vout. During the switch-on period 601 or the switch-off period 602, Vout is zero whereas the voltage of the secondary power source (e.g., 18V of the battery) is output to the output signal Vout during the power blackout period 603.

In the present example shown in FIGS. 4 and 5, the red wire is connected to the sensing block via a switch. The stray voltage of the red wire appears on the neutral wire as a phantom voltage during a switch-off period. The present power blackout sensing system can utilize the stray voltage that appears on the neutral wire to differentiate a power blackout condition from a switch-off condition. During the power blackout period, the sensing block provides the power from an integrated power source (e.g., a battery) to a connected system or device.

Figure 7:
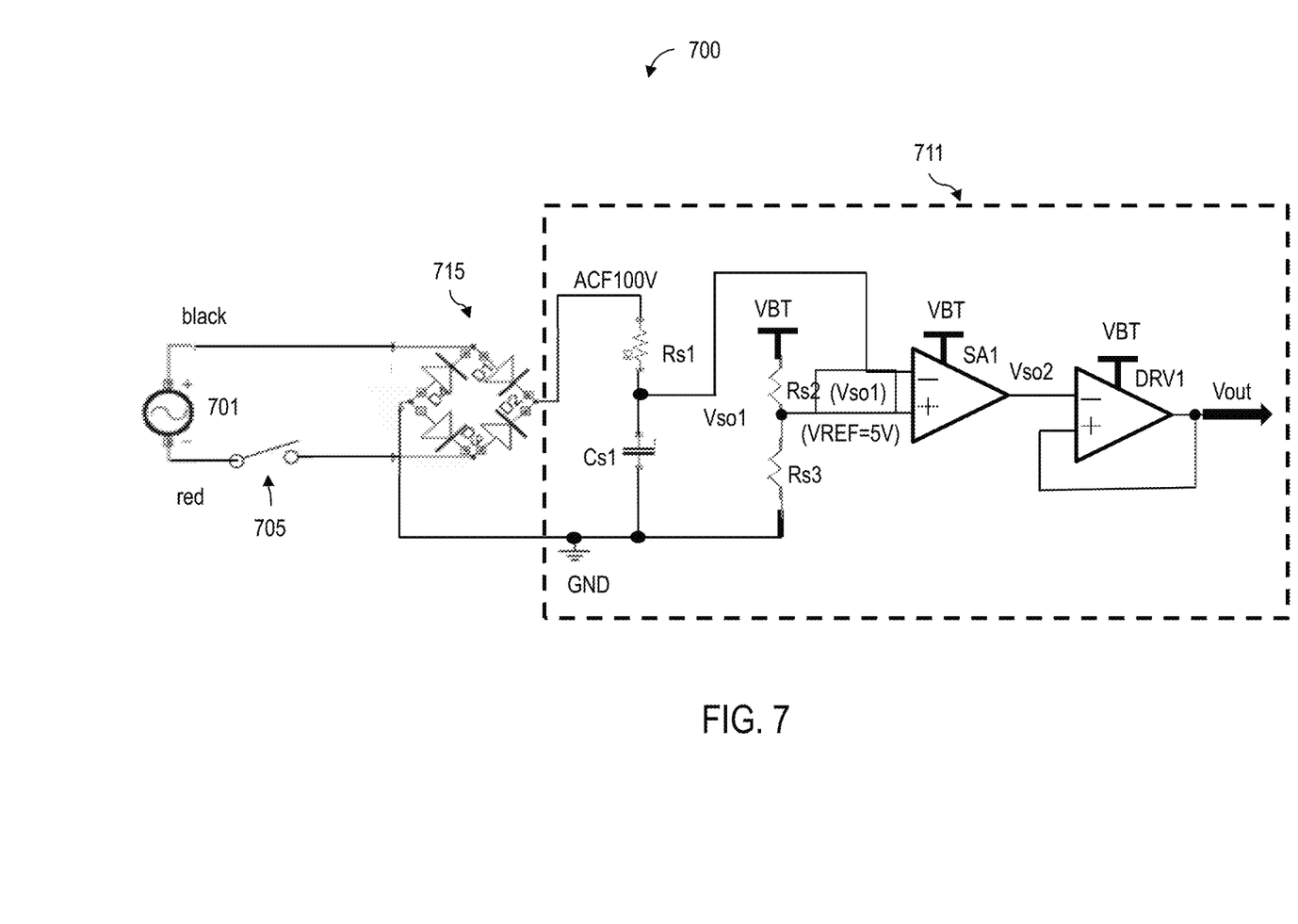
FIG. 7 shows an example power blackout sensing system including a sense amplifier, according to one embodiment.

FIG. 7 shows an example power blackout sensing system including a sense amplifier, according to one embodiment. The power blackout sensing system 700 includes a rectifier 715 for converting an AC power to a positive voltage, a resistor Rs1, a capacitor Cs1, a sensing amplifier SA1, resistors Rs2 and Rs3 for providing a reference voltage VREF to the sense amplifier SA1, and a driver DRV1 for amplifying a detected phantom voltage.

Figure 8:
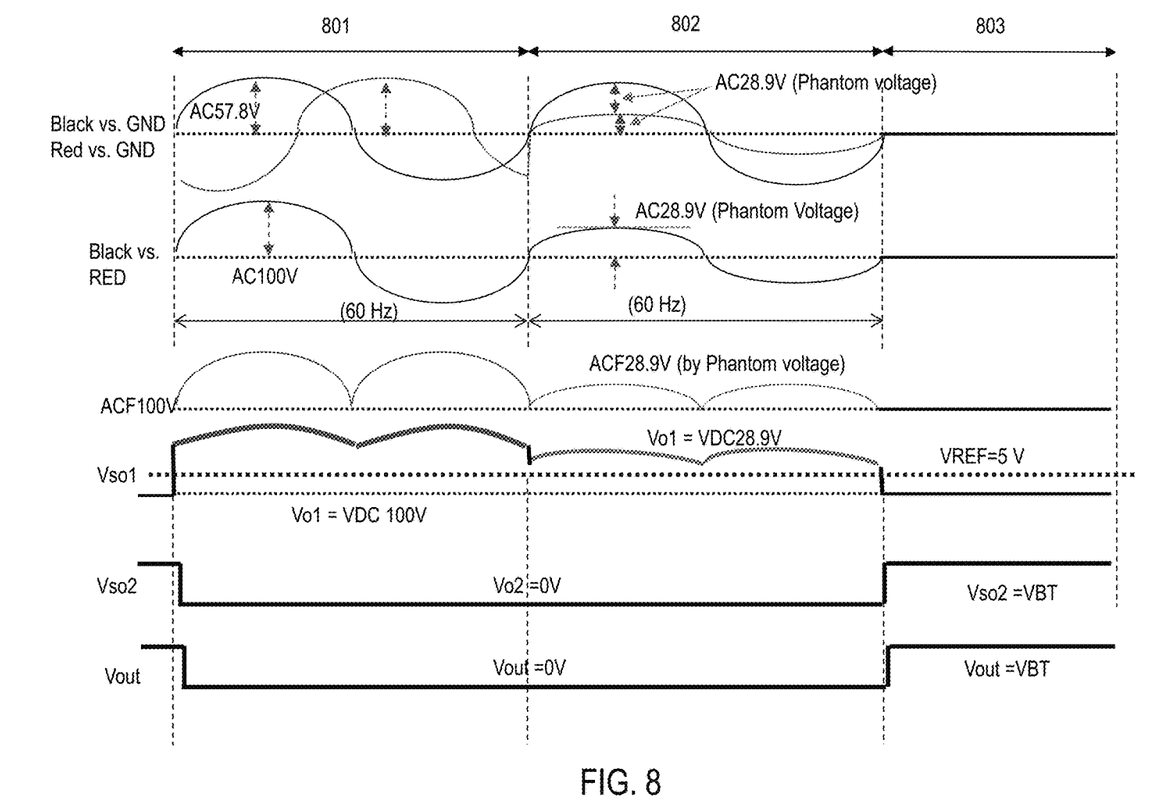
FIG. 8 shows an example timing diagram for the power blackout sensing system, according to one embodiment.

FIG. 8 shows an example timing diagram for the power blackout sensing system of FIG. 7. Referring to FIGS. 7 and 8, the phantom voltage is converted to a DC level Vso1 by the resistor Rs1 and the capacitor Cs1. When Vso1 is higher than a reference voltage (e.g., 5V) that is determined by the voltage VBT of the secondary power source and the ratio of the resistors Rs2 and Rs3, the sense amplifier SA1 amplifies the phantom voltage to a high-level output Vso2. The driver DRV1 provides a power loading to the output signal Vso2 of the sensing amplifier SA1 and generates the output signal Vout. The voltage of the output signal Vout can be the voltage VBT of the secondary power source during the blackout period 803. Similar to the previous example described with reference to FIGS. 2, 3, 5, and 6, the output signal Vout of the sensing block is zero during the switch-on period 801 or the switch-off period 802.

Figure 9:
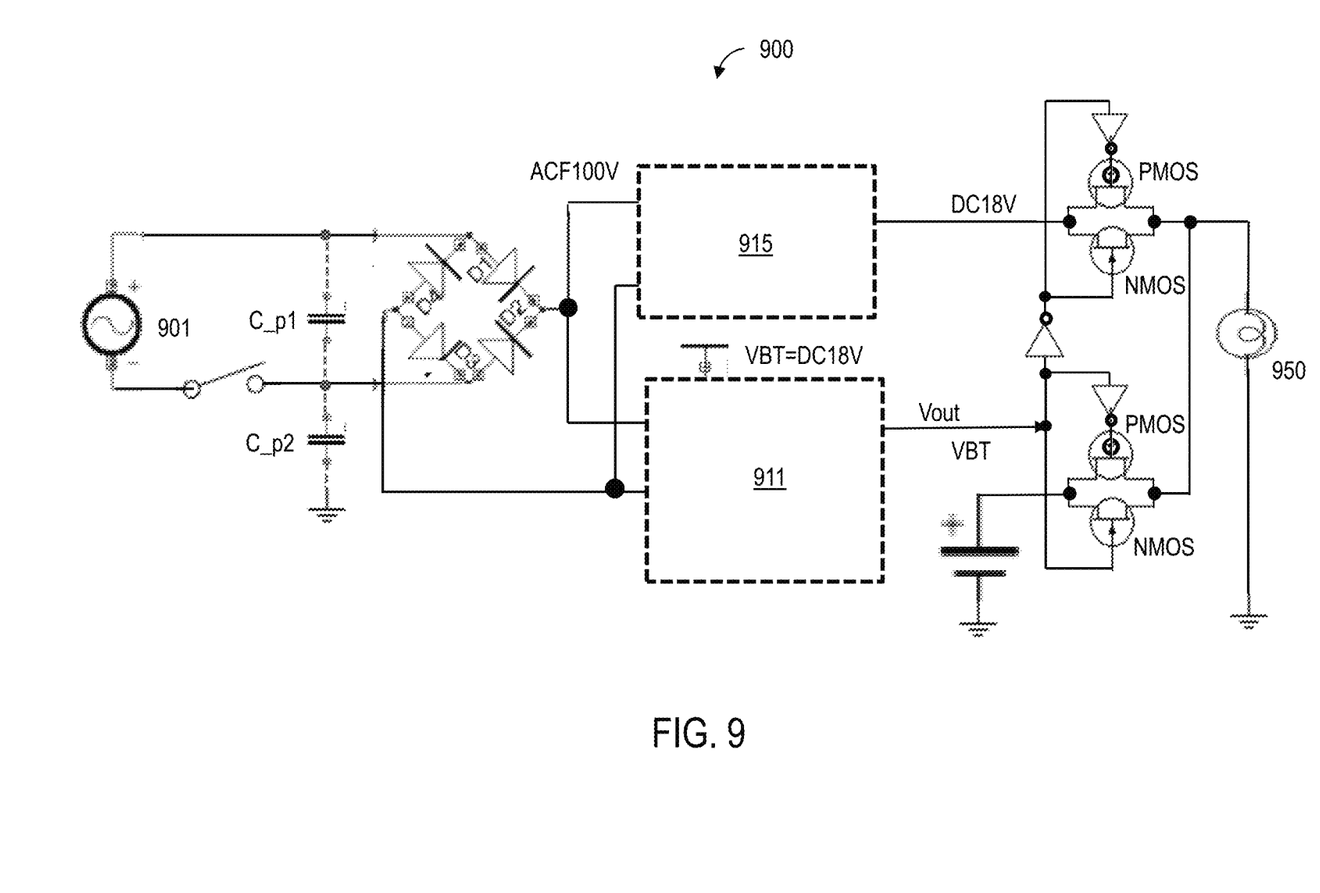
FIG. 9 shows an example system including a power blackout sensing system, according to one embodiment.

FIG. 9 shows an example system including a power blackout sensing system, according to one embodiment. The system includes an AC power source 901, an AC/DC converter 915, a sensing block 911, and a system or device 950 connected to the AC/DC converter 915 and the sensing block 911. The AC power source 901 is rectified to provide a rectified voltage ACF100V to the AC/DC converter 915 and the sensing block 911 for generating an output signal based on a power condition of the AC power source 901. During a normal operation, for example, a switch-on or switch-off condition, the AC power source 901 supplies the power to the connected system or device 950. Examples of the connected system or device include, but are not limited to, an emergency light, a high-precision machine, and a medical device. The sensing block 911 generates 0V on the Vout pin during the switch-on/off periods. During a switch-on period, the AC/DC converter 915 generates DC18V that is provided to the system or device 950. During a switch off period, the AC/DC converter 915 does not generate DC18V; therefore, no power is supplied to the system or device 950. However, during a power blackout period, the sensing block 911 generates the VBT (e.g., 18V from the secondary power source) and supplies the secondary power to the system or device 950.

According to one embodiment, a power black-out sensing system includes: a primary power source providing an alternating current (AC) power using three phase wires and a neutral wire; a secondary power source; a sensing block comprising one or more sensing elements; and a rectifier configured to rectify the AC power from the primary power source and providing a rectified power to the sensing block voltage detector. Two wires of the three phases wires and the neutral wire of the primary power source are connected to rectifier, and a first wire of the two wires is connected to the rectifier via a switch and a second wire of the two wires is directly connected to the rectifier. The sensing block detects a phantom voltage and provides an output signal corresponding the secondary power source during a blackout period.

The output signal may correspond to the primary power source during a switch-on period and a switch-off period.

The one or more sensing elements may include a resistor and a capacitor.

The phantom voltage may be converted to a direct current (DC) level by the resistor and the capacitor.

The sensing block may further include a first transistor that amplifies the phantom voltage and current when the DC level is higher than a base emitter voltage of the first transistor.

The sensing block may further include a second transistor and an inverter that convert the phantom voltage to intermediate voltages and provide the output signal.

The first wire may be a black wire and the second wire may be a red wire.

The first wire may be a red wire and the second wire may be the neutral wire.

The sensing block may further include a sensing amplifier coupled to the one or more sensing elements and a driver that are connected to the sensing amplifier in series.

The sensing amplifier may amplify the phantom voltage based on a reference voltage.

The power black-out sensing system may further an AC/DC converter. The sensing block may provide the output voltage corresponding to the secondary power source based on a signal received from the AC/DC converter.

The output signal corresponding the secondary power source may be provided to a device during the blackout period.

The sensing block may be integrated in the device.

The device may be one of an emergency light, a high-precision machine, and a medical device.

According to another embodiment, a phantom voltage detector includes one or more sensing elements coupled to a rectifier. The rectifier is configured to rectify an AC power from a primary power source. Two wires of three phases wires and a neutral wire of the primary power source are connected to the rectifier, and a first wire of the two wires is connected to the rectifier via a switch and a second wire of the two wires is directly connected to the rectifier. The one or more sensing elements detects a phantom voltage and the phantom voltage detector provides an output signal corresponding a secondary power source during a blackout period.

The output signal may correspond to the primary power source during a switch-on period and a switch-off period.

The one or more sensing elements may include a resistor and a capacitor.

The sensing block may further include one or more transistors and an inverter that convert the phantom voltage to the output signal.

The phantom voltage detector may further include a sensing amplifier coupled to the one or more sensing elements and a driver that are connected to the sensing amplifier in series.

The sensing amplifier may amplify the phantom voltage based on a reference voltage.

The above example embodiments have been described hereinabove to illustrate various embodiments of implementing a power blackout sensing system including a phantom voltage detector. Various modifications and departures from the disclosed example embodiments will occur to those having ordinary skill in the art. The subject matter that is intended to be within the scope of the invention is set forth in the following claims.

What is claimed is:
1. A power black-out sensing system comprising:
 a primary power source providing an alternating current (AC) power;
 a secondary power source;
 a sensing block comprising one or more sensing elements; and a rectifier configured to rectify the AC power from the primary power source and providing a rectified output voltage to the sensing block, wherein at least two wires of the primary power source are connected to the rectifier, and a first wire of the at least two wires is connected to the rectifier via a switch and a second wire of the at least two wires is directly connected to the rectifier, wherein the sensing block detects a phantom voltage during a switch-off period of a normal operation that is less than the rectified output voltage that is detected during a switch-on period of the normal operation, wherein the sensing block provides a first output signal having a first voltage level during the normal operation regardless of the switch-on period or the switch-off period, and wherein the sensing block provides a second output signal having a second voltage level corresponding the secondary power source during a blackout period regardless of a state of the switch.

2. The power black-out sensing system of claim 1, wherein the output signal corresponds to the primary power source during a switch-on period and a switch-off period.

3. The power black-out sensing system of claim 1, wherein the one or more sensing elements comprises a resistor and a capacitor.

4. The power black-out sensing system of claim 3, wherein the phantom voltage is converted to a direct current (DC) level by the resistor and the capacitor.

5. The power black-out sensing system of claim 4, wherein the sensing block further comprises a first transistor that amplifies the phantom voltage and current when the DC level is higher than a base emitter voltage of the first transistor.

6. The power black-out sensing system of claim 5, wherein the sensing block further comprises a second transistor and an inverter that convert the phantom voltage to intermediate voltages and provide the output signal.

7. The power black-out sensing system of claim 1, wherein the first wire is a neural wire.

8. The power black-out sensing system of claim 1, wherein the second wire is a neutral wire.

9. The power black-out sensing system of claim 1, wherein the sensing block further comprises a sensing amplifier coupled to the one or more sensing elements and a driver, and wherein the one or more sensing elements, the sensing amplifier, and the driver are connected in series.

10. The power black-out sensing system of claim 9, wherein the sensing amplifier amplifies the phantom voltage based on a reference voltage.

11. The power black-out sensing system of claim 1, wherein the sensing block further comprises an AC/DC converter, wherein the AC/DC converter provides the second output signal.

12. The power black-out sensing system of claim 1, wherein the output signal corresponding the secondary power source is provided to a device during the blackout period.

13. The power black-out sensing system of claim 12, wherein the sensing block is integrated in the device.

14. The power black-out sensing system of claim 12, wherein the device is one of an emergency light, a high-precision machine, and a medical device.

15. A phantom voltage detector comprising:
one or more sensing elements configured to receive a rectified voltage of an alternative current (AC) power from a rectifier and a secondary voltage from a secondary power source; and
an output driver coupled to the one or more sensing elements and configured to provide an output signal regardless of a state of a switch that is coupled to the rectifier,
wherein the one or more sensing elements detects a phantom voltage during a switch-off period of a normal operation that is less than the rectified voltage that is detected during a switch-on period of the normal operation, and
wherein the output signal that is output from the output driver has a first voltage level during the normal operation regardless of the switch-on period or the switch-off period and has a second voltage level corresponding the secondary voltage of the secondary power source during a blackout period regardless of the state of the switch.

16. The phantom voltage detector of claim 15, wherein the output signal corresponds to the primary power source during a switch-on period and a switch-off period.

17. The phantom voltage detector of claim 15, wherein the one or more sensing elements comprises a resistor and a capacitor.

18. The power black-out sensing system of claim 17, wherein the sensing block further comprises one or more transistors and an inverter that convert the phantom voltage to the output signal.

19. The phantom voltage detector of claim 15, further comprising a sensing amplifier coupled to the one or more sensing elements, and wherein the one or more sensing elements, the sensing amplifier, and the output driver are connected in series.

20. The phantom voltage detector of claim 19, wherein the sensing amplifier amplifies the phantom voltage based on a reference voltage.

* * * * *